United States Patent
Kim et al.

(10) Patent No.: US 9,117,708 B2
(45) Date of Patent: Aug. 25, 2015

(54) THIN FILM TRANSISTOR AND METHOD OF MANUFACTURING THE SAME

(71) Applicant: Samsung Display Co., Ltd., Yongin (KR)

(72) Inventors: Jung-Bae Kim, Yongin-si (KR); Bo-Yong Chung, Suwon-si (KR); Hae-Yeon Lee, Bucheon-si (KR); Yong-Jae Kim, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/330,859

(22) Filed: Jul. 14, 2014

(65) Prior Publication Data

US 2015/0028327 A1 Jan. 29, 2015

(30) Foreign Application Priority Data

Jul. 23, 2013 (KR) .................. 10-2013-0086426

(51) Int. Cl.
- *H01L 29/10* (2006.01)
- *H01L 27/12* (2006.01)
- *H01L 29/786* (2006.01)
- *H01L 21/16* (2006.01)
- *H01L 21/00* (2006.01)

(52) U.S. Cl.
CPC ........ *H01L 27/1255* (2013.01); *H01L 27/1225* (2013.01); *H01L 27/1259* (2013.01); *H01L 21/00* (2013.01); *H01L 21/16* (2013.01); *H01L 29/7869* (2013.01)

(58) Field of Classification Search
CPC ............ H01L 27/1248; H01L 27/1277; H01L 27/1281; H01L 29/66765; H01L 29/78678; H01L 29/7869; H01L 27/1225; H01L 27/1255; H01L 27/1259; H01L 21/16; H01L 21/00

USPC ........... 257/43, 40, 64, 59, 476, 61; 438/450, 438/161, 142, 754

See application file for complete search history.

(56) References Cited

U.S. PATENT DOCUMENTS

| | | | |
|---|---|---|---|
| 2005/0245046 A1* | 11/2005 | Takafuji et al. | 438/450 |
| 2008/0001142 A1* | 1/2008 | Cho et al. | 257/40 |
| 2009/0065778 A1* | 3/2009 | Tsubata et al. | 257/59 |
| 2009/0321737 A1 | 12/2009 | Isa et al. | |
| 2010/0117077 A1 | 5/2010 | Yamazaki et al. | |
| 2011/0133197 A1* | 6/2011 | Suzumura et al. | 257/64 |
| 2012/0108007 A1 | 5/2012 | Yamazaki et al. | |

FOREIGN PATENT DOCUMENTS

| | | |
|---|---|---|
| KR | 10-2010-0051560 | 5/2010 |
| KR | 10-2011-0029157 | 3/2011 |
| KR | 10-2012-0096881 | 8/2012 |

* cited by examiner

*Primary Examiner* — Mohammed Shamsuzzaman
(74) *Attorney, Agent, or Firm* — H.C. Park & Associates, PLC

(57) ABSTRACT

A thin film transistor includes a substrate, a gate electrode, a buffer layer, a gate insulating layer, an active layer, an etching stop layer, a source electrode and a drain electrode. The gate electrode is formed on the substrate. The buffer layer partially covers both side portions of the gate electrode. The gate insulating layer covers the gate electrode and the buffer layer. The active layer is formed on the gate insulating layer. The etching stop layer is formed on the active layer, and has a first opening and a second opening on the active layer. The source electrode is formed on the etching stop layer, and contacts with the active layer through the first opening. The drain electrode is formed on the etching stop layer, and is contacted with the active layer through the second opening.

9 Claims, 8 Drawing Sheets

THIN FILM TRANSISTOR AND METHOD OF MANUFACTURING THE SAME

CROSS REFERENCE TO RELATED APPLICATION

This application claims priority under 35 U.S.C. §119 to Korean Patent Application No. 10-2013-0086426, filed on Jul. 23, 2013, which is hereby incorporated by reference for all purposes as if fully set forth herein.

BACKGROUND

1. Technical Field

Exemplary embodiments of the present invention relate to a display device. More particularly, exemplary embodiments of the present invention relate to a thin film transistor and method of manufacturing the thin film transistor.

2. Description of the Background

When a high-resolution, large-area display is manufactured by using thin film transistors each having a bottom-gate structure, sizes of the thin film transistors should be reduced to secure an opening ratio. As sizes of the thin film transistors are reduced, a thickness of respective gate insulating layers of the thin film transistors may be decreased. Here, if a thickness of the gate insulating layer is decreased, a distance between a gate electrode and a source electrode and/or a distance between the gate electrode and a drain electrode may be shortened. Consequently, the gate electrode, the source electrode, and the drain electrode may be damaged. In addition, an overlap capacitance may be increased in an overlap region between the gate electrode and the source electrode and/or in an overlap region between the gate electrode and the drain electrode. Nevertheless, a thickness of the gate insulating layer should be increased to prevent an increase of the overlap capacitance. In addition, a size of the thin film transistors should be increased to secure (i.e., maintain) identical on-current characteristics. Therefore, sizes of the thin film transistors need to be reduced without an increase of the overlap capacitance to manufacture the high-resolution large-area display.

SUMMARY

Exemplary embodiments of the present invention provide a thin film transistor that is manufactured in a small size without an increase of an overlap capacitance.

Exemplary embodiments of the present invention provide a storage capacitor having an increased capacitance that is manufactured in a small size.

Additional features of the invention will be set forth in the description which follows, and in part will be apparent from the description, or may be learned by practice of the invention.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

Exemplary embodiments of the present invention disclose a thin film transistor. The thin film transistor includes a substrate. The thin film transistor includes a gate electrode that is disposed on the substrate. The thin film transistor includes a buffer layer partially covering side portions of the gate electrode. The thin film transistor includes a gate insulating layer covering the gate electrode and the buffer layer. The thin film transistor includes an active layer that is disposed on the gate insulating layer. The thin film transistor includes an etching stop layer disposed on the active layer. The etching stop layer has a first opening and a second opening on the active layer. The thin film transistor includes a source electrode disposed on the etching stop layer. The source electrode contacts with the active layer through the first opening. The thin film transistor includes a drain electrode which is disposed on the etching stop layer, the drain electrode contacts with the active layer through the second opening.

Exemplary embodiments of the present invention disclose a method of manufacturing a thin film transistor. The method includes forming a gate electrode on a substrate. The method includes forming a buffer layer on side portions of the gate electrode. The method includes forming a gate insulating layer on the gate electrode and the buffer layer. The method includes forming an active layer on the gate insulating layer. The method includes forming an etching stop layer on the active layer, the etching stop layer comprising a first opening and a second opening on the active layer. The method also includes forming a source electrode and a drain electrode, the source electrode and the drain electrode contacting with the active layer through the first opening and the second opening, respectively.

Exemplary embodiments of the present invention disclose a storage capacitor. The storage capacitor includes a substrate. The storage capacitor includes a first electrode disposed on the substrate. The storage capacitor includes a buffer layer on side portions of the first electrode. The storage capacitor includes an insulating layer covering the first electrode and the buffer layer. The storage capacitor includes an insulating interlayer which is disposed on the insulating layer. The storage capacitor includes a second electrode which is disposed on the insulating interlayer, the second electrode opposing the first electrode.

Exemplary embodiments of the present invention disclose a method of manufacturing a storage capacitor. The method includes forming a first electrode on a substrate. The method includes forming a buffer layer on side portions of the first electrode. The method includes forming an insulating layer on the first electrode and the buffer layer. The method includes forming an insulating interlayer on the insulating layer. The method also includes forming a second electrode opposing the first electrode on the insulating interlayer.

Exemplary embodiments of the present invention disclose a thin film transistor. The thin film transistor includes a gate electrode, source electrode and a drain electrode formed on the substrate. The thin film transistor includes an insulating layer covering the gate electrode, the insulating layer comprising inclined surfaces and a downward-concave region, wherein a buffer layer is formed to cover both sides of the gate electrode. The thin film transistor includes an active layer formed on the insulating layer and an etching stop layer comprising openings formed on a portion of the active layer, wherein the active layer contacting with the source electrode and the drain electrode through the openings. An overlap region is formed, the overlap region includes a portion of the buffer layer, a portion of the insulating layer, and a portion of the active layer, wherein a thickness of the buffer layer at the overlap region is smaller than a thickness of the buffer layer at the substrate region, and wherein the insulating layer is thinly formed by the buffer layer.

Exemplary embodiments of the present invention disclose a semiconductor element. The element includes a substrate. The element includes a first electrode disposed on the substrate. The element includes a first insulating layer disposed on the first electrode and comprising an opening exposing a first portion of the upper surface of the first electrode, the first portion of the upper surface being less than the entire upper surface of the first electrode. The element includes a second insulating layer disposed on the first insulating layer and in the opening of the first insulating layer. The element includes an active layer disposed on the second insulating layer. The element includes a third insulating layer disposed on the active layer, the third insulating layer comprising a first opening and a second opening. The element includes a second electrode disposed on the third insulating layer, the second electrode contacting the active layer through the first opening. The element includes a third electrode disposed on the third insulating layer, the third electrode contacting the active layer through the second opening.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DESCRIPTION OF THE ILLUSTRATED EMBODIMENTS

Figure 1:
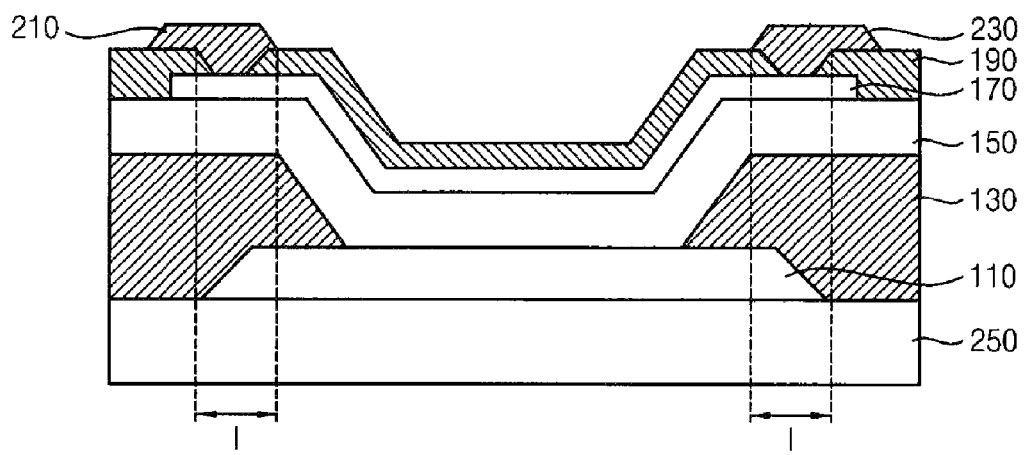
FIG. 1 is a cross-sectional view illustrating a thin film transistor according to exemplary embodiments.

A thin film transistor and a method for manufacturing a thin film transistor are disclosed. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Exemplary embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals generally refer to like or similar elements throughout. As used herein, the term "and/or" includes any and all combinations of one or more of the associated listed items.

It will be understood that, although the terms first, second, and third may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," and "upper", may be used herein for ease of description to describe one element or feature's relationship to another element(s) or feature(s) as illustrated in the figures. It will be understood that the spatially relative terms are intended to encompass different orientations of the apparatus in use or operation in addition to the orientation depicted in the figures. For example, if the apparatus in the figures is turned over, elements described as "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of an apparatus and are not intended to limit the scope of the inventive concept.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having meanings that are consistent with their meanings in the context of the relevant art and will not be interpreted in an idealized or overly formal sense unless expressly so defined herein.

FIG. 1 is a cross-sectional view illustrating a thin film transistor according to exemplary embodiments.

Referring to FIG. 1, the thin film transistor 100 may include a substrate 250, a gate electrode 110, a buffer layer 130, a gate insulating layer 150, an active layer 170, an etching stop layer 190, a source electrode 210, and a drain electrode 230.

For example, the substrate 250 may include glass-based materials or flexible plastic-based materials. For example, the substrate 250 may correspond to a glass substrate, a quartz substrate, and a polymer resin substrate. In some exemplary embodiments, the substrate 250 may further include an insulating layer (not shown) disposed on the substrate 250. The insulating layer may include insulation materials. For example, the insulating layer may include inorganic insulation materials including at least one of $SiO_x$, $SiN_x$, $SiO_xN_y$, $SiO_xC_y$, and $SiC_xN_y$.

The gate electrode 110 may be formed on the substrate 250. The gate electrode 110 may include at least one of a metal, an alloy, a metallic nitride, a conductive metal oxide, and a transparent conductive material. For example, the gate electrode 110 may include at least one of aluminum (Al), aluminum alloy, aluminum nitride ($AlN_x$), silver (Ag), silver alloy, tungsten (W), tungsten nitride ($WN_x$), copper (Cu), copper alloy, nickel (Ni), chrome (Cr), chrome nitride ($CrN_x$), molybdenum (Mo), molybdenum alloy, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), indium tin oxide (ITO), stannum oxide ($SnO_x$), indium oxide ($InO_x$), gallium oxide ($GaO_x$), and indium zinc oxide (IZO). These materials may be used alone or in the form of mixture thereof.

In some exemplary embodiments, the gate electrode 110 may have a bottom gate structure. For example, a thickness of the gate electrode 110 may be about 5000 Å. When a thickness of the gate electrode 110 is increased, a resistance of the gate electrode 110 may be decreased.

For example, the buffer layer 130 may be formed on the substrate 250. The buffer layer 130 may partially cover both side portions of the gate electrode 110. The buffer layer 130 may include oxide-based materials. For example, the buffer layer 130 may include at least one of silicon oxide ($SiO_x$), silicon nitride ($SiN_x$), silicon oxynitride ($SiO_xN_y$), silicon oxycarbide ($SiO_xC_y$), and silicon cabonitride ($SiC_x$Ny). A thickness of the buffer layer 130 disposed on the gate electrode 110 and thickness of the buffer layer 130 disposed on the substrate 250 may be substantially same. Further, opposing surfaces of the buffer layer 130 may be inclined to each other.

Both side portions of the gate electrode 110 may be respective edge portions of the gate electrode 110. Here, an electric field may be concentrated in the edge portions of the gate electrode 110. The thin film transistor 100 may be damaged by the electric field concentration at the edge portions of the gate electrode 110. Accordingly, the buffer layer 130 may be formed at both side portions of the gate electrode 110.

The buffer layer 130 formed at both side portions of the gate electrode 110 may increase a distance between the gate electrode 110 and the source electrode 210 and/or a distance between the gate electrode 110 and the drain electrode 230. When the distance is increased, the buffer layer 130 may prevent damage of the gate electrode 110, the source electrode 210, and the drain electrode 230. A capacitance that is caused at an overlap region between the gate electrode 110 and the source electrode 210 and/or an overlap region between the gate electrode 110 and the drain electrode 230 may be reduced. In exemplary embodiments, the overlap region may be referred to as an electric field concentration minimization region I. The electric field concentration minimization region I may include a portion of the buffer layer 130, a portion of the gate insulating layer 150, and a portion of the active layer 170. Thus, a thickness of the electric field concentration minimization region I (i.e., a distance between the gate electrode 110 and the source electrode 210 and/or a distance between the gate electrode 110 and the drain electrode 230) may be a summation of a thickness of the buffer layer 130, a thickness of the gate insulating layer 150, and a thickness of the active layer 170.

For example, the gate insulating layer 150 may cover the gate electrode 110 and the buffer layer 130. The gate insulating layer 150 may be formed between the gate electrode 110 and the active layer 170. The gate electrode 110 and the active layer 170 may be insulated by the gate insulating layer 150. The gate insulating layer 150 may be formed along the opposing surfaces of the buffer layer 130. The gate insulating layer 150 may constitute a downward-concave region. The gate insulating layer 150 may be formed by using a silicon oxide and/or a metallic oxide. For example, the gate insulating layer 150 may include at least one of silicon oxide ($SiO_x$), silicon nitride ($SiN_x$), silicon oxynitride ($SiO_xN_y$), silicon oxycarbide ($SiO_xC_y$), silicon cabonitride ($SiC_xN_y$), hafnium oxide ($HfO_x$), aluminium oxide ($AlO_x$), zirconium oxide ($ZrO_x$), titanium oxide ($TiO_x$), and tantalum oxide ($TaO_x$).

Since the buffer layer 130 is formed on the substrate 250, a thickness of the electric field concentration minimization region I may be increased. Accordingly, the gate insulating layer 150 can be thinly formed because a thickness of the electric field concentration minimization region is increased. When the gate insulating layer 150 is thinly formed, a distance between the gate electrode 110 and the active layer 170 may be shortened. As a result, on-current characteristics of the thin film transistor 100 may be improved. Thus, a size of the thin film transistor 100 may be reduced, thereby an opening ratio of a high-resolution large-area display may be increased.

For example, the active layer 170 may be formed on the gate insulating layer 150. The active layer 170 may include at least one of indium (In), gallium (Ga), and zinc (Zn). The active layer 170 may be contacted with the source electrode 210 and the drain electrode 230 through openings of the etching stop layer 190, respectively. The active layer 170 may be formed along the opposing surfaces of the buffer layer 130. For example, the active layer 170 may be formed to constitute a downward-concave region. Accordingly, a distance between the gate electrode 110 and the active layer 170 may be shortened. In addition, on-current characteristics of the thin film transistor 100 may be improved. Thus, a size of the thin film transistor 100 may be reduced, and an opening ratio of a high-resolution large-area display may be increased.

The etching stop layer 190 may be formed on a portion of the active layer 170 and a portion of the gate insulating layer 150. The etching stop layer 190 may include a first opening and a second opening. In the etching stop layer 190, the source electrode 210 may contact the active layer 170 through the first opening, and the drain electrode 230 may contact the active layer 170 through the second opening. The etching stop layer 190 may include at least one of silicon oxide ($SiO_x$), silicon nitride ($SiN_x$), silicon oxynitride ($SiO_xN_y$), silicon oxycarbide ($SiO_xC_y$), silicon cabonitride ($SiC_xN_y$), hafnium oxide ($HfO_x$), aluminium oxide ($AlO_x$), zirconium oxide ($ZrO_x$), titanium oxide ($TiO_x$), and tantalum oxide ($TaO_x$).

For example, the source electrode 210 and the drain electrode 230 may be formed on the etching stop layer 190. Here, the source electrode 210 and the drain electrode 230 may contact the active layer 170 through the first opening and the second opening, respectively. The source electrode 210 and the drain electrode 230 may include at least one of a metal, an alloy, a metallic nitride, a conductive metal oxide, and a transparent conductive material. For example, the source electrode 210 and the drain electrode 230 may include at least one of aluminum (Al), aluminum alloy, aluminum nitride ($AlN_x$), silver (Ag), silver alloy, tungsten (W), tungsten nitride ($WN_x$), copper (Cu), copper alloy, nickel (Ni), chrome (Cr), chrome nitride ($CrN_x$), molybdenum (Mo), molybdenum alloy, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), indium tin oxide (ITO), stannum oxide ($SnO_x$), indium oxide ($InO_x$), gallium oxide ($GaO_x$), and indium zinc oxide (IZO).

As described above, on-current characteristics of the thin film transistor 100 may be improved because a thickness of the gate electrode 110 is increased, the gate insulating layer 150 is thinly formed, and the buffer layer 130 is formed between the gate electrode 110 and the gate insulating layer 150. As a result, a size of the thin film transistor 100 may be reduced, and an opening ratio of a high-resolution large-area display may be increased. Therefore, the high-resolution large-area display may be manufactured by using the thin film transistor 100.

FIGS. 2A through 2F are cross-sectional views illustrating a method of manufacturing a thin film transistor of FIG. 1.

Figure 2A:
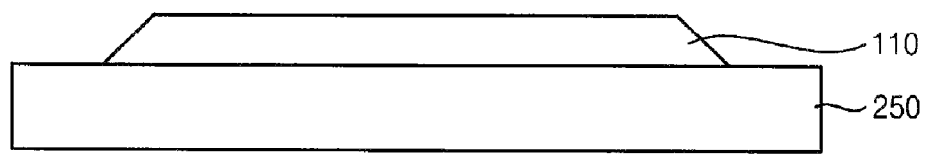
FIGS. 2A through 2F are cross-sectional views illustrating a method of manufacturing a thin film transistor of FIG. 1.

Referring to FIG. 2A, a gate electrode 110 may be formed on a substrate 250. As illustrated in FIG. 2A, for example, a material for forming the gate electrode 110 may be deposited on the substrate 250 and patterned using a mask to form the gate electrode 110.

Figure 2B:
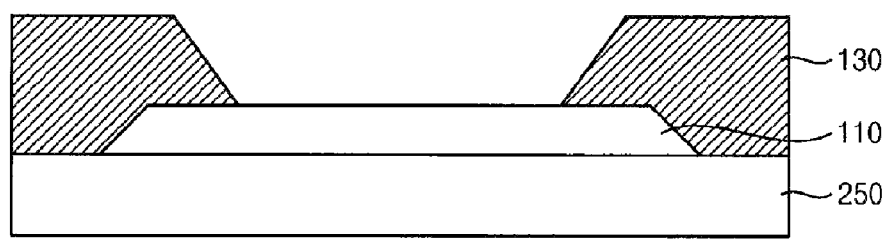
Figure 2C:
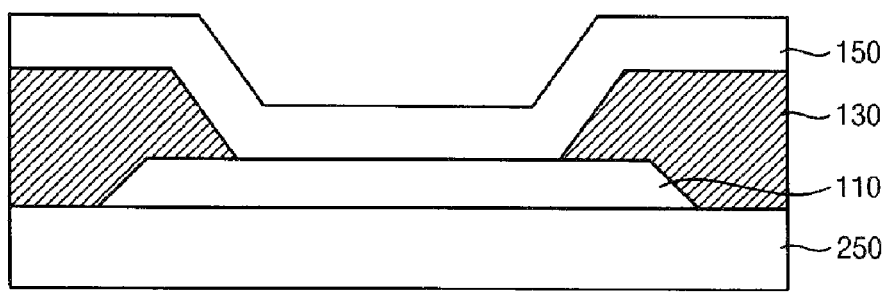

Referring to FIG. 2B, a buffer layer 130 covering side portions of the gate electrode 110 may be formed on the gate electrode 110. As illustrated in FIG. 2B, a material for forming the buffer layer 130 may be deposited on the gate electrode 110 and patterned using a mask to form the buffer layer 130. A thickness of the buffer layer 130 disposed on the gate electrode 110 and a thickness of the buffer layer 130 disposed on the substrate 250 may be substantially same. Further, opposing surfaces of the buffer layer 130 may be inclined to each other. Although FIG. 1 and FIG. 2C show that the buffer layer 130 is patterned to exposed an upper surface of the gate electrode 110, other variations are possible. For example, when the buffer layer 130 is formed by stacking at least of two layers (e.g., $SiO_x$ and $SiN_x$), a process forming a gate insulating layer 150 may be omitted. For example, an etching rate (e.g., etching speed) of the $SiO_x$ may be slow, an etching rate of the $SiN_x$ may be fast. The buffer layer 130 may be formed without an exposure the upper surface of the gate electrode 110 by using the difference of the etching rate of the $SiO_x$ and the $SiN_x$. The $SiO_x$ may be formed at a bottom of buffer layer 130, and the $SiN_x$ may be formed at a top of buffer layer 130 (e.g., on the SiOx). As illustrated in FIG. 2C, the buffer layer 130 may be patterned to form as a shape combined with the buffer layer 130 and the gate insulating layer 150 by using a mask. In this case, the $SiO_x$ may be thinly formed at a concave region of the buffer layer 130. However, when the buffer layer 130 is formed by stacking at least of two layers, a surface of a concave region of the buffer layer 130 may be rough. When an active layer 170 is formed on the rough surface, a thin film transistor may generate a malfunction. Thus, forming the gate insulating layer 150 on the buffer layer 130 and the gate electrode 110 is further desirable after the buffer layer 130 is formed according to exemplary embodiments of the present invention.

Referring to FIG. 2C, for example, a gate insulating layer 150 covering the gate electrode 110 and the buffer layer 130 may be formed. The gate insulating layer 150 may be thinly deposited on the buffer layer 130 and the gate electrode 110. When the gate insulating layer 150 is thinly deposited, a distance between the gate electrode 110 and an active layer 170 may be shortened. As a result, on-current characteristics of a thin film transistor 100 may be improved. In addition, a size of the thin film transistor 100 may be reduced, and an opening ratio of a high-resolution large-area display may be increased. The gate insulating layer 150 may be formed along opposing surfaces of the buffer layer 130. The inclined surface of the buffer layer 130 may be parallel with the inclined surface of the gate insulating layer 150. As illustrated in FIG. 2C, the gate insulating layer 150 may be formed to constitute a downward-concave region.

Figure 2D:
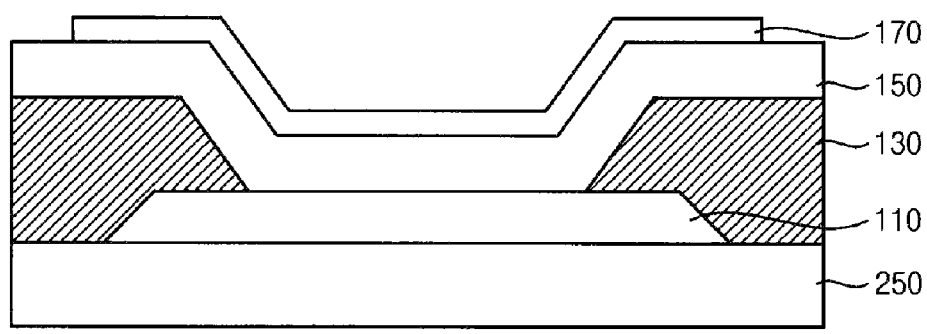

Referring to FIG. 2D, for example, the active layer 170 may be formed on the gate insulating layer 150. As illustrated in FIG. 2D, a material for forming the active layer 170 may be deposited on the gate insulating layer 150 and patterned using a mask to form the active layer 170. The active layer 170 may be formed along the opposing surfaces of the buffer layer 130. The inclined surface of the buffer layer 130 may be parallel with the inclined surface of the active layer 170. The active layer 170 may be formed to constitute a downward-concave region. Accordingly, a distance between the gate electrode 110 and the active layer 170 may be shortened. As a result, on-current characteristics of the thin film transistor 100 may be improved. In addition, a size of the thin film transistor 100 may be reduced, and an opening ratio of a high-resolution large-area display may be increased.

Figure 2E:
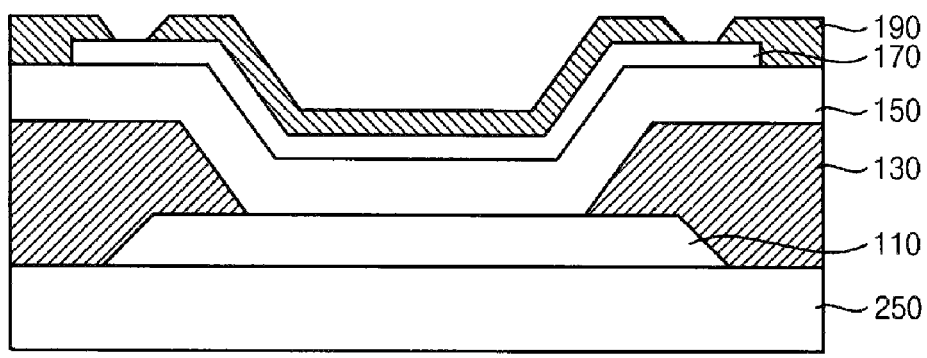

Referring to FIG. 2E, for example, an etching stop layer 190 including a first opening and a second opening may be formed on the active layer 170. As illustrated in FIG. 2E, the etching stop layer 190 may be deposited on the active layer 170 and a portion of the gate insulating layer 150. The etching stop layer 190 may be patterned by using a mask to form a first opening and a second opening exposing the active layer.

Figure 2F:
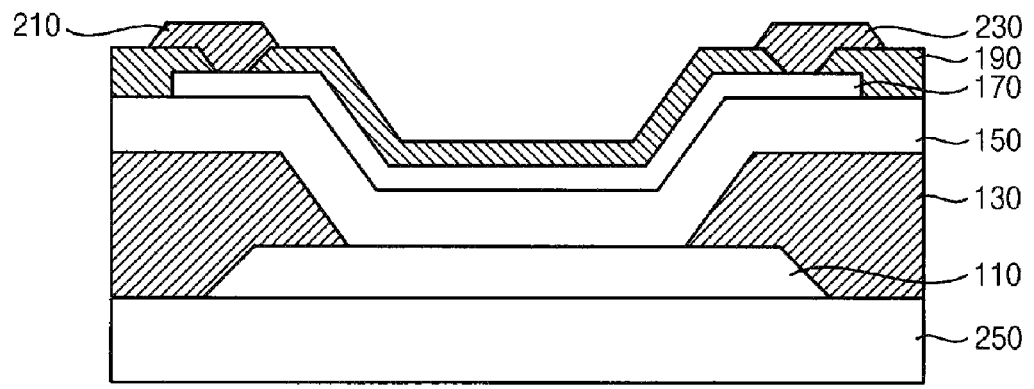

Referring to FIG. 2F, for example, a source electrode 210 may be formed contacting with the active layer 170 through the first opening and a drain electrode 230 may be formed contacting with the active layer 170 through the second opening. As illustrated in FIG. 2F, for example, a material for forming the source electrode 210 and the drain electrode 230 may be formed on the substrate and patterned using a mask to form the source electrode 210 and the drain electrode 230.

Figure 3:
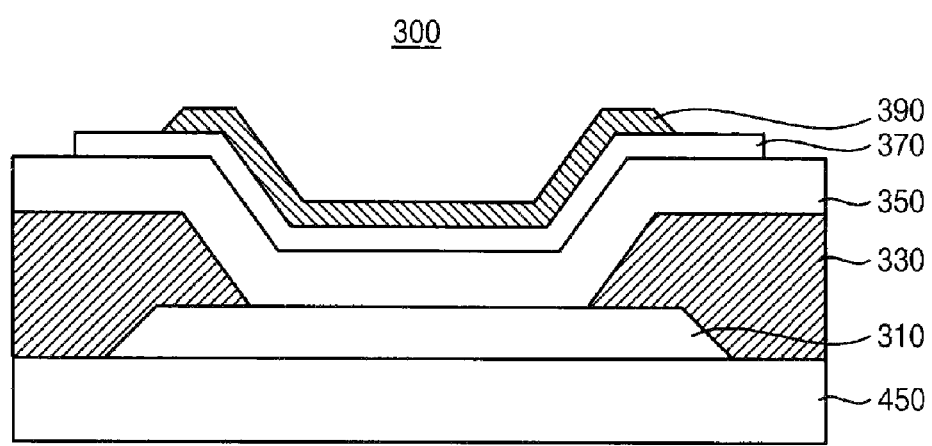
FIG. 3 is a cross-sectional view illustrating a storage capacitor according to exemplary embodiments.

FIG. 3 is a cross-sectional view illustrating a storage capacitor according to exemplary embodiments.

Referring to FIG. 3, for example, a storage capacitor 300 may include a substrate 450, a first electrode 310, a buffer layer 330, an insulating layer 350, an insulating interlayer 370, and a second electrode 390.

The substrate 450 may include glass-based materials or flexible plastic-based materials. For example, the substrate 450 may correspond to a glass substrate, a quartz substrate, or a polymer resin substrate. In some exemplary embodiments, the substrate 450 may further include an insulating layer disposed on the substrate 450. The insulating layer may include insulation materials. For example, materials of the insulating layer may include inorganic insulation materials such as at least one of $SiO_x$, $SiN_x$, $SiO_xN_y$, $SiO_xC_y$, and $SiC_xN_y$.

The first electrode 310 may be formed on the substrate 450. The first electrode 310 may include at least one of metal, an alloy, a metallic nitride, a conductive metal oxide, and a transparent conductive material. For example, the first electrode 310 may include at least one of aluminum (Al), aluminum alloy, aluminum nitride ($AlN_x$), silver (Ag), silver alloy, tungsten (W), tungsten nitride ($WN_x$), copper (Cu), copper alloy, nickel (Ni), chrome (Cr), chrome nitride ($CrN_x$), molybdenum (Mo), molybdenum alloy, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), indium tin oxide (ITO), stannum oxide ($SnO_x$), indium oxide ($InO_x$), gallium oxide ($GaO_x$), and indium zinc oxide (IZO). These materials may be used alone or in the form of a mixture thereof.

In exemplary embodiments, a thickness of the first electrode 310 may have about 5000 Å. When a thickness of the first electrode 310 is increased, a resistance of the first electrode 310 may be decreased.

For example, the buffer layer 330 may be formed on the substrate 450. The buffer layer 330 may partially cover both side portions of the first electrode 310. The buffer layer 330 may include oxide-based materials. For example, the buffer layer 330 may include at least one of silicon oxide ($SiO_x$), silicon nitride ($SiN_x$), silicon oxynitride ($SiO_xN_y$), silicon oxycarbide ($SiO_xC_y$), and silicon cabonitride ($SiC_xN_y$). A thickness of the buffer layer 330 disposed on the first electrode 310 and thickness of the buffer layer 330 disposed on the substrate 450 may be substantially same. For example, opposing surfaces of the buffer layers 330 may be inclined surface to each other.

Both side portions of the first electrode 310 may be respective edge portions of the first electrode 310. Here, an electric field may be concentrated to the edge portions of the first electrode 310. The storage capacitor 300 may be damaged by the electric field concentration at the edge portions of the first electrode 310. Accordingly, the buffer layer 330 may be formed at the both side portions of the first electrode 310.

The buffer layer 330 formed at the both side portions of the first electrode 310 may increase a distance between the first electrode 310 and the second electrode 390. When the distance is increased, the buffer layer 330 may prevent damages of the first electrode 310 and the second electrode 390.

The insulating layer 350 may cover the first electrode 310 and the buffer layer 330. The insulating layer 350 may be formed between the first electrode 310 and the insulating interlayer 370. The first electrode 310 and the second electrode 390 may be insulated by the insulating layer 350. The insulating layer 350 may be formed along with the opposing surface of the buffer layer 330. The insulating layer 350 may constitute a downward-concave region. The insulating layer 350 may be formed by using a silicon oxide or a metallic oxide. For example, the insulating layer 350 may include at least one of silicon oxide ($SiO_x$), silicon nitride ($SiN_x$), silicon oxynitride ($SiO_xN_y$), silicon oxycarbide ($SiO_xC_y$), silicon cabonitride ($SiC_xN_y$), hafnium oxide ($HfO_x$), aluminium oxide ($AlO_x$), zirconium oxide ($ZrO_x$), titanium oxide ($TiO_x$), and tantalum oxide ($TaO_x$).

Since the buffer layer 330 is formed on the substrate 450, a thickness of between the first electrode 310 and the second electrode 390 may be increased at the electric field concentration region that is formed in the buffer layer 330. Accordingly, the insulating layer 350 can be thinly formed because a thickness of the electric field concentration minimization region is increased. When the insulating layer 350 is thinly formed, a distance between the first electrode 310 and the second electrode 390 may be shortened. As a result, a capacitance of the storage capacitor 300 may be increased. Thus, a size of the storage capacitor 300 may be reduced, and an opening ratio of a high-resolution large-area display may be increased.

The insulating interlayer 370 may be formed on the insulating layer 350. The insulating interlayer 370 may be amorphous silicon, poly silicon or an active layer having organic semi-conductor materials. For example, the active layer may include indium (In), gallium (Ga), or zinc (Zn). In exemplary embodiments, the insulating interlayer 370 may be an etching stop layer including at least one of silicon oxide ($SiO_x$), silicon nitride ($SiN_x$), silicon oxynitride ($SiO_xN_y$), silicon oxycarbide ($SiO_xC_y$), silicon cabonitride ($SiC_xN_y$), hafnium oxide ($HfO_x$), aluminium oxide ($AlO_x$), zirconium oxide ($ZrO_x$), titanium oxide ($TiO_x$), and tantalum oxide ($TaO_x$). The insulating interlayer 370 may be disposed between the second electrode 390 and the insulating layer 350, and may insulate the first electrode 310 and the second electrode 390.

The insulating interlayer 370 may be formed along with the opposing surfaces of the buffer layer 330. The insulating interlayer 370 may constitute a downward-concave region. Accordingly, a distance between the first electrode 310 and the second electrode 390 may be shortened, and the capacitance of the storage capacitor 300 may be increased. Thus, a size of the storage capacitor 300 may be reduced, and the opening ratio of a high-resolution large-area display may be increased.

For example, the second electrode 390 may be formed on the insulating interlayer 370. The second electrode 390 may include at least one of metal, an alloy, a metallic nitride, a conductive metal oxide, and a transparent conductive material. For example, the second electrode 390 may include at least one of aluminum (Al), aluminum alloy, aluminum nitride (AlNx), silver (Ag), silver alloy, tungsten (W), tungsten nitride ($WN_x$), copper (Cu), copper alloy, nickel (Ni), chrome (Cr), chrome nitride ($CrN_x$), molybdenum (Mo), molybdenum alloy, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), indium tin oxide (ITO), stannum oxide ($SnO_x$), indium oxide ($InO_x$), gallium oxide ($GaO_x$), and indium zinc oxide (IZO).

As described above, the capacitance of the storage capacitor 300 may be improved because a thickness of the first electrode 310 is increased, the insulating layer 350 is thinly formed, and the buffer layer 330 is formed between the first electrode 310 and the second electrode 390. As a result, a size of the storage capacitor 300 may be reduced, and an opening ratio of a high-resolution large-area display may be increased. Therefore, the high-resolution large-area display may be manufactured by using the storage capacitor 300.

FIGS. 4A through 4E are cross-sectional views illustrating a method of manufacturing a storage capacitor of FIG. 3.

Figure 4A:
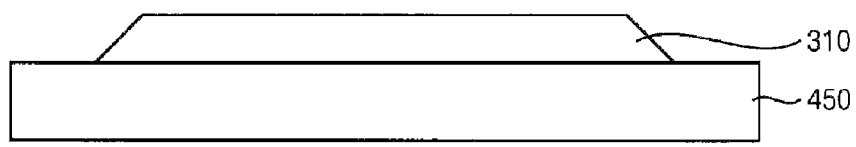
FIGS. 4A through 4E are cross-sectional views illustrating a method of manufacturing a storage capacitor of FIG. 3.

Referring to FIG. 4A, for example, a first electrode 310 may be formed on a substrate 450. As illustrated in FIG. 4A, for example, a material for forming the first electrode 310 may be deposited on the substrate 450 and patterned using a mask to form the first electrode 310, as illustrated in FIG. 4A.

Figure 4B:
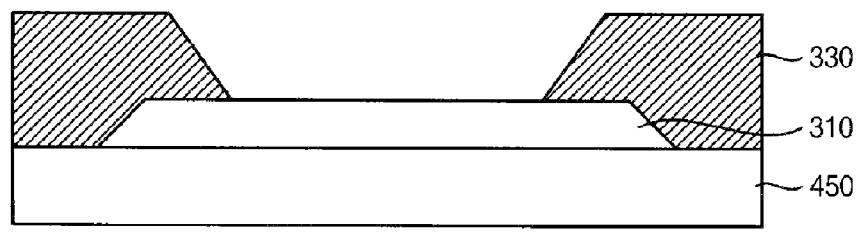

Referring to FIG. 4B, for example, a buffer layer 330 covering both side portions of the first electrode 310 may be formed on the first electrode 310. As illustrated in FIG. 4B, for example, a material for forming the buffer layer 330 may be deposited on the substrate 450 and the first electrode 310 and patterned using a mask to form the buffer layer 330. A thickness of the buffer layer 330 disposed on the first electrode 310 and thickness of the buffer layer 330 disposed on the substrate 450 may be substantially same, and opposing surfaces of the buffer layer 330 may be inclined to each other.

Figure 4C:
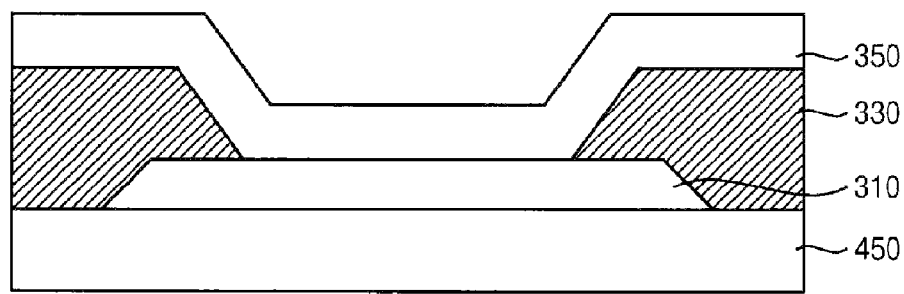

Referring to FIG. 4C, for example, an insulating layer 350 covering the first electrode 310 and the buffer layer 330 may be formed. The insulating layer 350 may be thinly deposited on the buffer layer 330 and the first electrode 310. When the insulating layer 350 is thinly deposited, a distance between the first electrode 310 and a second electrode 390 may be shortened at region without the buffer layer 330. As a result, a capacitance of a storage capacitor 300 may be improved. In addition, a size of the storage capacitor 300 may be reduced, and an opening ratio of a high-resolution large-area display may be increased. The insulating layer 350 may be formed along with opposing surfaces of the buffer layer 330. The inclined surface of the buffer layer 330 may be parallel with the inclined surface of the insulating layer 350. As illustrated in FIG. 4C, the insulating layer 350 may be formed to constitute a downward-concave region.

Figure 4D:
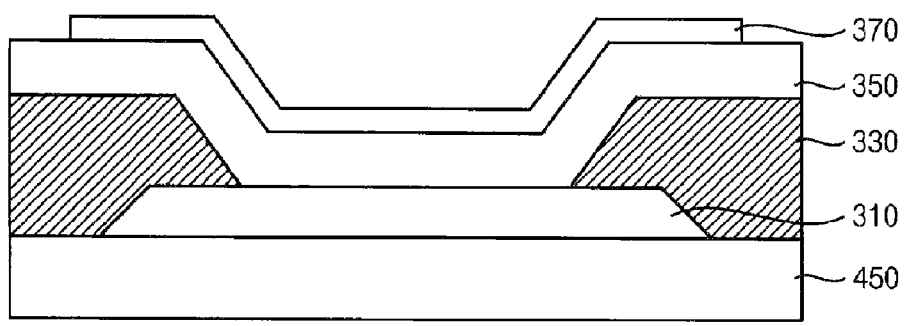

Referring to FIG. 4D, for example, an insulating interlayer 370 may be formed on the insulating layer 350. As illustrated in FIG. 4D, the insulating interlayer 370 may be deposited on the insulating layer 350, and the insulating interlayer 370 may be patterned by using a mask. The insulating interlayer 370 may be formed along with the opposing surfaces of the buffer layer 330. The inclined surface of the buffer layer 330 may be parallel with the inclined surface of the insulating interlayer 370. The insulating interlayer 370 may be formed to constitute a downward-concave region. Accordingly, a distance between the first electrode 310 and the second electrode 390 may be shortened. As a result, the capacitance of the storage capacitor 300 may be improved. In addition, a size of the storage capacitor 300 may be reduced, and an opening ratio of a high-resolution large-area display may be increased.

Figure 4E:
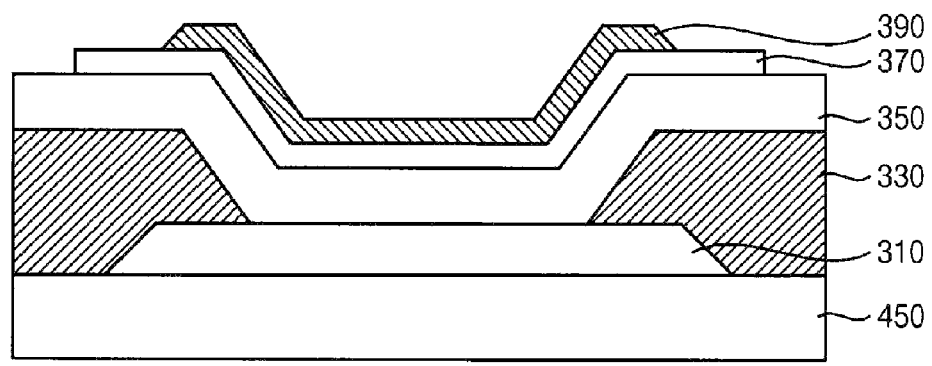

Referring to FIG. 4E, for example, a second electrode 390 may be formed on the insulating interlayer 370. As illustrated in FIG. 4E, for example, a material for forming the second electrode 390 may be deposited on the insulating interlayer 370 and patterned using a mask to form the second electrode 390.

Figure 5:
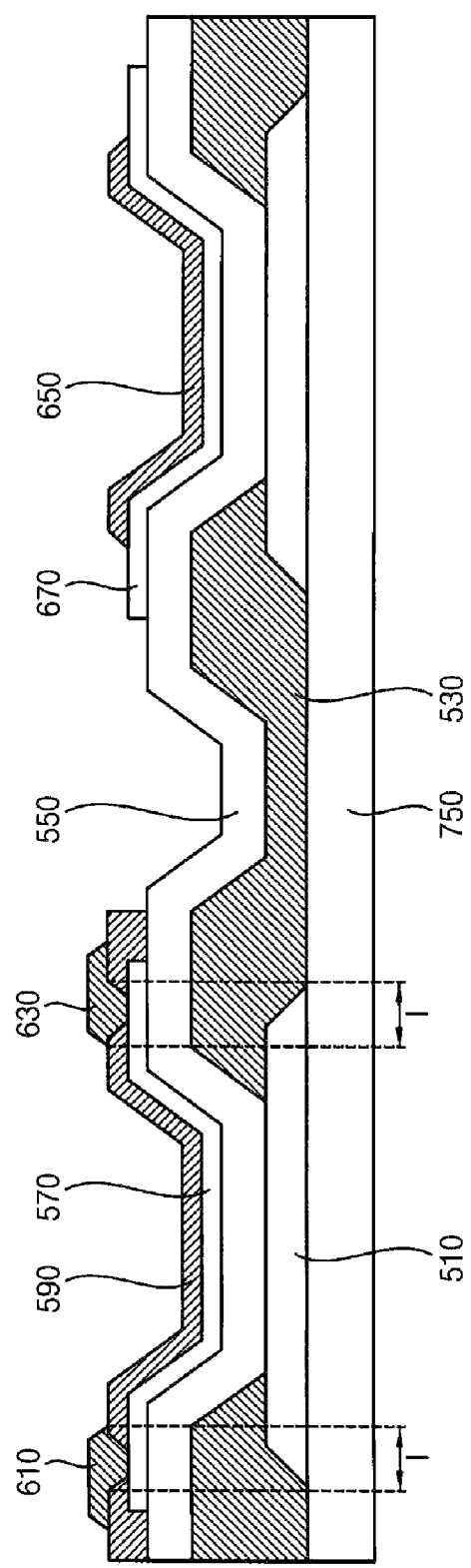
FIG. 5 is a cross-sectional view illustrating a thin film transistor and a storage capacitor according to exemplary embodiments.

FIG. 5 is a cross-sectional view illustrating a thin film transistor and a storage capacitor according to exemplary embodiments.

Referring to FIG. 5, for example, a display panel including a thin film transistor and a storage capacitor is partially illustrated. A structure of the display panel may include a substrate 750, a gate electrode 510, a buffer layer 530, a gate insulating layer 550, an active layer 570, an etching stop layer 590, a source electrode 610, a drain electrode 630, an insulating interlayer 670, and a second electrode 650. Since the structure of the display panel is described with reference to FIGS. 1 through 4, duplicated descriptions will not be repeated. As illustrated in FIG. 5, for example, the thin film transistor and the storage capacitor may be manufactured at the same time.

As described above, on-current characteristics of the thin film transistor 100 may be improved because a thickness of the gate electrode 110 is increased, the gate insulating layer 150 is thinly formed, and the buffer layer 130 is formed between the gate electrode 110 and the gate insulating layer 150. The capacitance of the storage capacitor 300 may be improved because a thickness of the first electrode 310 is increased, the insulating layer 350 is thinly formed, and the buffer layer 330 is formed between the first electrode 310 and the second electrode 390. As a result, a size of the thin film transistor and the storage capacitor may be reduced, an opening ratio of a high-resolution large-area display may be increased. Therefore, a high-resolution large-area display may be manufactured by using the thin film transistor and the storage capacitor.

The present invention may be applied to any electronic device including at least one thin film transistor. For example, the present invention may be applied to a mobile phone, a smart phone, a laptop, a tablet, a computer, a personal digital assistant (PDA), a portable multimedia player (PMP), a digital camera, a music player (e.g., MP3 player), a portable game console, or a navigation system.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor comprising:
a substrate;
a gate electrode disposed on the substrate;
a buffer layer partially covering an upper surface and completely covering inclined side surfaces of the gate electrode;
a gate insulating layer disposed on the gate electrode and the buffer layer;
an active layer disposed on the gate insulating layer;
an etching stop layer disposed on the active layer, the etching stop layer comprising a first opening and a second opening;
a source electrode disposed on the etching stop layer, the source electrode contacting with the active layer through the first opening; and
a drain electrode disposed on the etching stop layer, the drain electrode contacting with the active layer through the second opening,
wherein the gate insulating layer is disposed directly on the upper surface of the gate electrode, and the active layer is disposed directly on an upper surface of the gate insulating layer, and a thickness of the buffer layer at the upper surface of the gate electrode is smaller than a thickness of the buffer layer at the inclined side surfaces of the gate electrode, and the gate insulating layer is thinner than the buffer layer and wherein a distance between the gate electrode and the source electrode and a distance between the gate electrode and the drain electrode are increased by the buffer layer.

2. The transistor of claim 1, wherein opposing surfaces of the buffer layer are inclined to each other.

3. The transistor of claim 2, wherein inclined surfaces of the gate insulating layer, inclined surfaces of the active layer, and inclined surfaces of the etching stop layer define a downward-concave region.

4. The transistor of claim 1, wherein an electric field concentration minimization region exist at an overlap region between the gate electrode and the source electrode and an overlap region between the gate electrode and the drain electrode.

5. The transistor of claim 4, wherein the electric field concentration minimization region comprises a portion of the buffer layer, a portion of the gate insulating layer, and a portion of the active layer.

6. The transistor of claim 1, wherein the thin film transistor is included in a display panel.

7. A semiconductor element, comprising:
a substrate;
a first electrode disposed on the substrate;
a first insulating layer disposed on the first electrode and comprising an opening exposing a first portion of an upper surface of the first electrode, the first portion of the upper surface being less than the entire upper surface of the first electrode and completely covering inclined side surfaces of the first electrode;
a second insulating layer disposed on the first insulating layer and in the opening of the first insulating layer;
an active layer disposed on the second insulating layer;
a third insulating layer disposed on the active layer, the third insulating layer comprising a first opening and a second opening;
a second electrode disposed on the third insulating layer, the second electrode contacting the active layer through the first opening; and
a third electrode disposed on the third insulating layer, the third electrode contacting the active layer through the second opening,
wherein the second insulating layer is disposed directly on the upper surface of the first electrode, and the active layer is disposed directly on an upper surface of the second insulating layer, and a thickness of the first insulating layer at the upper surface of the first electrode is smaller than a thickness of the first insulating layer at the inclined side surfaces of the first electrode, and the second insulating layer is thinner than the first insulating layer and wherein a distance between the first electrode and the second electrode and a distance between the first electrode and the third electrode are increased by the first insulating layer.

8. The semiconductor element of claim 7, wherein:
portions of the first insulating layer and the second insulating layer are disposed directly between the first electrode and the second electrode, and
a portion of the second insulating layer, but not a portion of the first insulating layer, is disposed directly between the first portion of the upper surface of the first electrode and the active layer.

9. The semiconductor element of claim 7, wherein the first insulating layer is disposed directly on the first electrode, and the second insulating layer is disposed directly on the first electrode.

* * * * *